United States Patent [19]

Jacobson et al.

[11] Patent Number: 4,874,631
[45] Date of Patent: Oct. 17, 1989

[54] MULTI-CHAMBER DEPOSITION SYSTEM

[75] Inventors: Richard L. Jacobson, Roseville; Frank R. Jeffrey, Shoreview; Roger K. Westerberg, Cottage Grove, all of Minn.

[73] Assignee: Minnesota Mining and Manufacturing Company, St. Paul, Minn.

[21] Appl. No.: 157,238

[22] Filed: Feb. 16, 1988

Related U.S. Application Data

[63] Continuation of Ser. No. 877,161, Jun. 23, 1986, abandoned.

[51] Int. Cl.⁴ ............................................. C23C 16/00
[52] U.S. Cl. ..................... 427/39; 427/74; 427/177; 427/255.5; 427/255.7; 427/294; 118/718; 118/719; 118/723
[58] Field of Search .............. 427/39, 74, 177, 255.5, 427/255.7, 294; 118/718, 719, 723

[56] References Cited

U.S. PATENT DOCUMENTS

| 3,294,670 | 12/1966 | Charschan et al. | 204/298 |
|---|---|---|---|
| 3,805,736 | 4/1974 | Foehring et al. | 118/49 |
| 3,965,163 | 6/1976 | Oda et al. | 260/530 |
| 4,015,558 | 4/1977 | Small et al. | 118/6 |
| 4,400,409 | 8/1963 | Izu et al. | 427/39 |
| 4,410,558 | 10/1983 | Izu et al. | 427/39 |
| 4,438,723 | 3/1984 | Cannella et al. | 118/718 |

Primary Examiner—Richard Bueker
Attorney, Agent, or Firm—Donald M. Sell; Walter N. Kirn; Leland D. Schultz

[57] ABSTRACT

A system for the simultaneous deposition of different coatings onto a thin web within a large volume vacuum chamber is disclosed which chamber is provided with a plurality of deposition chambers in which the different layers are deposited onto the film as its moves from a supply roll to a finished take-up roll of coated web. The deposition chambers provided within the large vacuum chamber are provided with separate seals which minimize back diffusion of any dopant gas from adjacent deposition chambers.

1 Claim, 3 Drawing Sheets

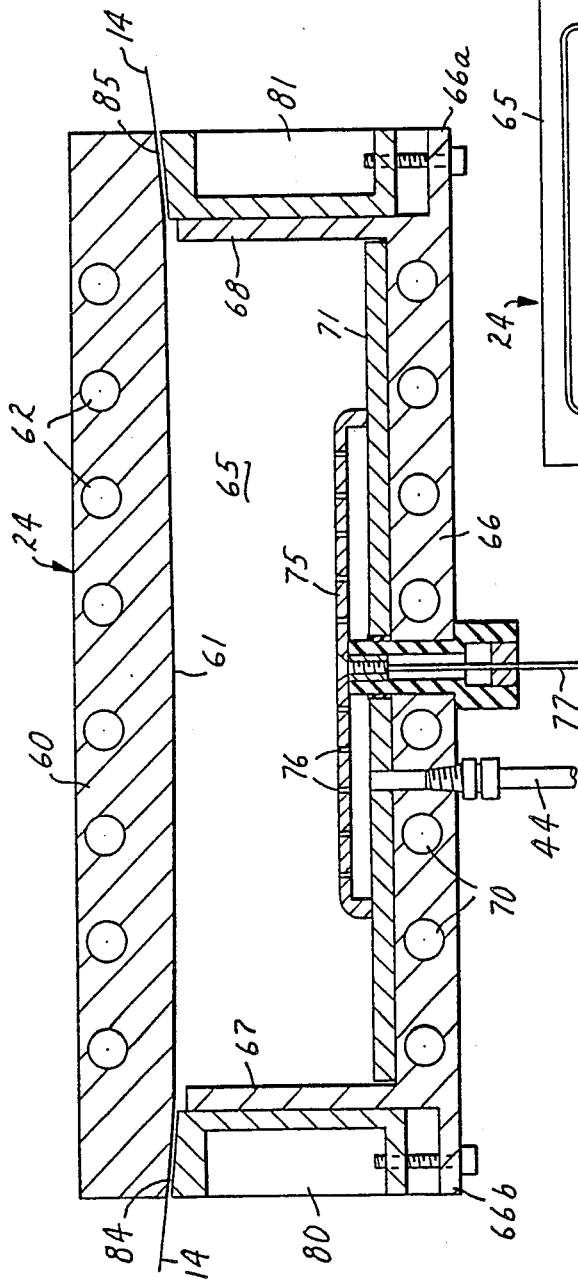
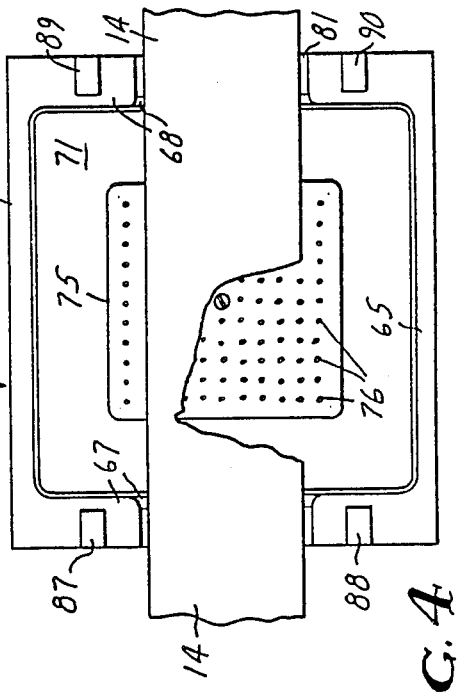
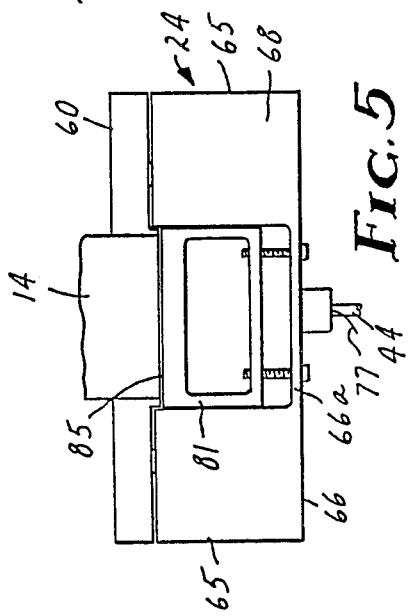

MULTI-CHAMBER DEPOSITION SYSTEM

The Government of the United States of America has rights in this invention pursuant to Subcontract No. ZB-4-03056-2 awarded by the U.S. Department of Energy.

This is a continuation of application Ser. No. 877,161 filed June 23, 1986 now abandoned.

BACKGROUND OF THE INVENTION

1. Field of the Invention

The present invention is directed to a method and apparatus for sequential deposition of thin-film coatings successively onto a web in the presence of a vacuum, and in one aspect, to an improved apparatus having a plurality of deposition chambers arranged within a single high vacuum chamber for the application of different thin-film coatings serially.

2. Description of the Prior Art

A variety of applications is known for thin-film coating application wherein said coating comprises at least two layers of different composition. In particular, in the manufacture of photovoltaic devices, the need exists for an efficient and economical generation of multi-layer thin-film coatings. This need is increased when the electrical and photoresponsive characteristics of the individual layers must be controlled.

U.S. Pat. No. 3,294,670, Charschan et al., discloses a continuously operating vacuum processing apparatus including a plurality of interconnected, open-ended chambers, with individual chambers surrounding aperture portions of a channel and containing processing atmospheres to which material in the channel is exposed. In this device means are connected to the multiple chambers for maintaining a predetermined evacuated pressure in the chambers. The apparatus is said to be especially useful for depositing thin films of tantalum, as utilized in electronic circuit fabrication, wherein controlled oxidation as provided by the deposition apparatus leads to reproducible electrical properties.

Foehring et al., in U.S. Pat. No. 3,805,736, disclose an apparatus for carrying out mass transfer reactions in a reaction chamber utilizing laminar flow to provide diffusion limited transport and isolation between process steps. The deposition apparatus includes means defining a vapor transport zone within a deposition chamber comprising a first vapor diffuser means extending longitudinally across said vapor transport zone as adapted to dispense a first gaseous phase material in laminary flow which is substantially parallel to a substrate surface and perpendicular to the path of substrate travel, with exhaust means disposed in opposed relationship and at least one additional adjacent vapor diffuser means. The vapor transport zones are structurally in fully open communication with one another, and process wise, substantially serially isolated as a result of laminar flow.

Wakefield, in U.S. Pat. No. 3,965,163, discloses a method of forming semiconductor grade silicon from lower grade silicon wherein a p-type layer is formed over an n-type layer via diffusion into the n-type layer in a second reaction chamber.

Small et al., in U.S. Pat. No. 4,015,558, disclose a multi-layer vapor deposition apparatus which discloses a plurality of serially arranged coating chambers with valve means disposed at opposite ends of each of the associated exit and entrance chambers for sealing the coating chambers and interrupting communication with the coating chamber along with individual means for creating a vacuum condition in each of the coating chambers.

Matatsgu Izu et al., in U.S. Pat. No. 4,400,409, disclose a method of making a photovoltaic panel comprising forming a roll of a web of a flexible substrate material with one or more electrode forming regions thereon, unrolling said substrate roll substantially continuously into a partially evacuated space including at least one silicon depositing region therein where there are deposited over at least some of said one or more electrode forming regions at least two thin flexible silicon films of opposite conductivity (P and N) type, one or more of said films forming a photovoltaic depletion region, said substrate formed in a substantially continuous web, and each of said silicon films is deposited in a separate glow discharge region past which said web is moved to form a substantially continuous deposition process. According to Izu et al, each of the deposition chambers, when a plurality of same are used, is connected by an isolation passageway and the exhaust from each chamber should be sufficient to isolate each of the chambers; however, an inert carrier gas can be bled into each passageway to sweep the passageway clear of any gases from the chamber on either side of the passageway. At column 13, lines 14–17, it is indicated that "It also is feasible that all of the chamber deposition areas be enclosed in a single chamber isolated one from another", however, there are no teachings as to how this might be accomplished or what benefits might accrue.

Cannella et al., in U.S. Pat. No. 4,438,723, disclose a multiple chamber deposition system and isolation means including a slot interconnecting first and second chambers and means for establishing a gas flow from the slot into the first chamber at a rate sufficient to maintain at least $10^4$ ratio of the concentration of an element in the first chamber to an element in the second chamber.

In contrast to the aforereferenced background art, the instant invention comprises a unitary vacuum chamber having contained therein a plurality of discrete deposition chambers including conductance limiting slits with a single vacuum pump means providing adequately low pressure for simultaneous deposition of material in each of the chambers without detectable diffusion of one process gas from one chamber into other chambers.

It is, therefore, an object of the instant invention to provide for a multiple coating vacuum deposition system which is less complex than prior art vacuum deposition systems and thus subject to less downtime.

It is, additionally, an object of the present invention to provide for a multiple chamber vacuum deposition system which is, as a function in reduced complexity, more economical to construct and operate.

It is, further, an object of the present invention to provide for a multiple chamber vacuum deposition system wherein superior levels of isolation between deposition chambers are obtained.

SUMMARY OF THE INVENTION

The present invention is directed to a novel apparatus comprising a large vacuum chamber in which is disposed a plurality of deposition chambers wherein a gas or predetermined mixture of gases is introduced into each chamber from which is deposited, onto a moving web, a thin-film coating by glow discharge. Each deposition chamber is formed for isolation from the other chambers but are formed to permit continued advancement of a web through the chambers to which the coatings are applied without the diffusion of any detectable quantities of gas from one deposition chamber reaching another of the chambers.

The apparatus comprises a large vacuum chamber in which is provided means for supporting a supply roll of the web to be coated, preferably a web cleaning chamber, a plurality of deposition chambers, drive means for the web and the take-up roll to rewind the coated web.

Each deposition chamber is provided with a platen on one surface of which is disposed a web guide surface, and opposite this platen is formed a generally rectangular chamber having side walls, opposed end walls, and a bottom wall. The bottom wall is provided with an electrode through which is diffused the process gas for use in the deposition process carried on within the chamber. Suitable electrical connections are made to the electrode and to the platen to affect the glow discharge deposition within the chamber. The platen is spaced slightly from the side walls and the end walls are each formed with a recessed area having a length slightly greater than the width of the web to form an entrance slit, and an exit slit for the web to pass into the chamber and out of the chamber along the guide surface of the platen. Each end wall is formed with an adjustable gate to vary the width of the slit, but such adjustment is only necessary where varying web materials are to be coated with the thin-film coatings by deposition within the chambers.

Means are provided for the initial evacuation of the single outer vacuum chamber, and then a partial vacuum is maintained within the outer chamber to a value of about 40 millitorr while gas flows into the process chambers.

The method of the present invention comprises the steps of evacuating a large chamber in which has been placed a roll of uncoated polymeric web material, continuously advancing the web material from the supply roll through a web cleaning chamber in which hydrogen gas is introduced and a glow discharge is produced, continuously advancing the web through a first deposition chamber to apply a thin-film coating to the web, continuously advancing the web to a second deposition chamber on which is applied a second thin-film coating and then through additional deposition chambers and then winding the coated web, continuously introducing a process gas into the deposition chambers during the advancing of the web in the presence of heat and an electrical potential, and maintaining the pressure within the deposition chambers at a value higher than the pressure in the large chamber surrounding the deposition chamber.

BRIEF DESCRIPTION OF THE DRAWINGS

This invention will be further described with reference to the accompanying drawing wherein:

FIG. 3 is a longitudinal sectional view of one of the deposition chambers;

FIG. 4 is a plan view of a deposition chamber with one side removed; and

FIG. 5 is an end view of the deposition chamber of FIG. 3.

DESCRIPTION OF THE PREFERRED EMBODIMENT

Figure 1:
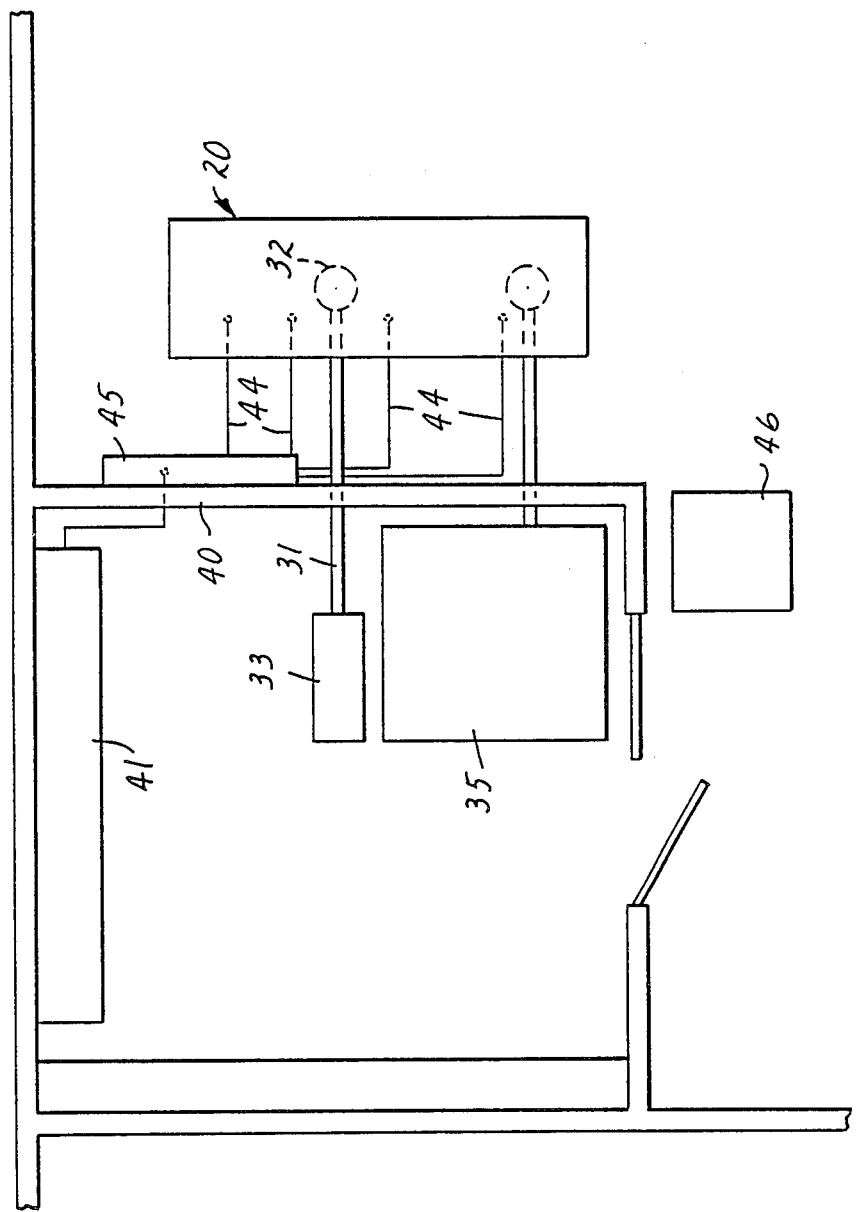
FIG. 1 is a diagrammatic plan view of a multi-chambered deposition system and the layout of the system.

The present invention finds particular application in the deposition of three discrete film-like coatings onto a flexible substrate or web. In the device described, the same has been used for the discrete glow discharge deposition of hydrogenated amorphous silicon onto a metallized polyimide substrate for the manufacture of photovoltaic cells.

A web 14 is drawn from a supply roll 15 which is rotatably mounted within a large vacuum chamber 20. The web 14 is directed around an idler roll 21, through a web cleaning chamber 22 and a plurality of deposition chambers 23, 24, and 25. From the deposition chamber 25 the web is directed around a second idler roll 26 by means of the web driving roll or capstan 28 onto a driven take-up roll 30. In each of the deposition chambers 23, 24 and 25 a different process gas is introduced continuously. The thin film coating results from the glow discharge deposition of at least one element from the process gas onto the web in the presence of heat and an electrical potential, AC or DC.

As will hereinafter be described, the deposition chambers are structured such that the web can move continuously from one chamber to another chamber with minimal back diffusion of gas from an adjacent deposition chamber. Thus the three or more thin-film like coatings may be deposited on the web during a single pass from the supply roll to the take-up roll.

Referring now to FIG. 1, the large vacuum chamber 20 is disposed within an area and has a turbomolecular pump 32 connected by a pipe 31 to a mechanical pump 33 for the initial pump-down of the large vacuum chamber 20 after the web supply has been placed therein. A suitable high vacuum turbomolecular pump package is available from Lebold-Heraeus of 5700 Mellon Road, Export, Pa. and is identified as TMP450 with a D30A mechanical pump. This pump package then serves to evacuate the chamber and remove gases generated in the deposition chambers during the heating of the same. The base pressure obtained with this pump is about $1 \times 10^{-6}$ Torr or lower. A process pump 35 is connected to the vacuum chamber 20 to maintain a controlled rate of gas pumping during the deposition process. This is a high volume pump which will pump 300 liters per second from the chamber, and one such pump is available from Leybold-Heraeus and pump package is identified as a WA 1000 Roots blower and a DK 200 mechanical pump. This pump will maintain pressures of about 0.04 Torr at process gas flow rates of about 350 standard cubic centimeters per minute (SCCM). THe gases are stored behind a wall 40 from the vacuum chamber and are piped to the deposition chambers. The gases, are provided in cylinders and the cylinders are stored in a cabinet 41. Each cylinder is provided with a pressure regulator and inert gas purge unit which is connected to one or more valves leading to a gas flow controller. The gas flow controllers from one or more of the cylinders are then connected to a gas mixing chamber and the gas goes from the mixing chamber to one of the deposition chambers. The gas flow rate to the mixing chamber is controllable to within about 1% of a given set point. The mass flow controllers and the mixing chambers are disposed in a cabinet 45, and the process gases are connected by tubes 44 to the process chambers 22, 23, 24 and 25.

The electronic control instruments are stored in a cabinet 46 located adjacent the deposition system which monitors the glow discharge power levels, platen temperatures, vacuum pressures, gas flow rates, web speed and web tension.

Figure 2:
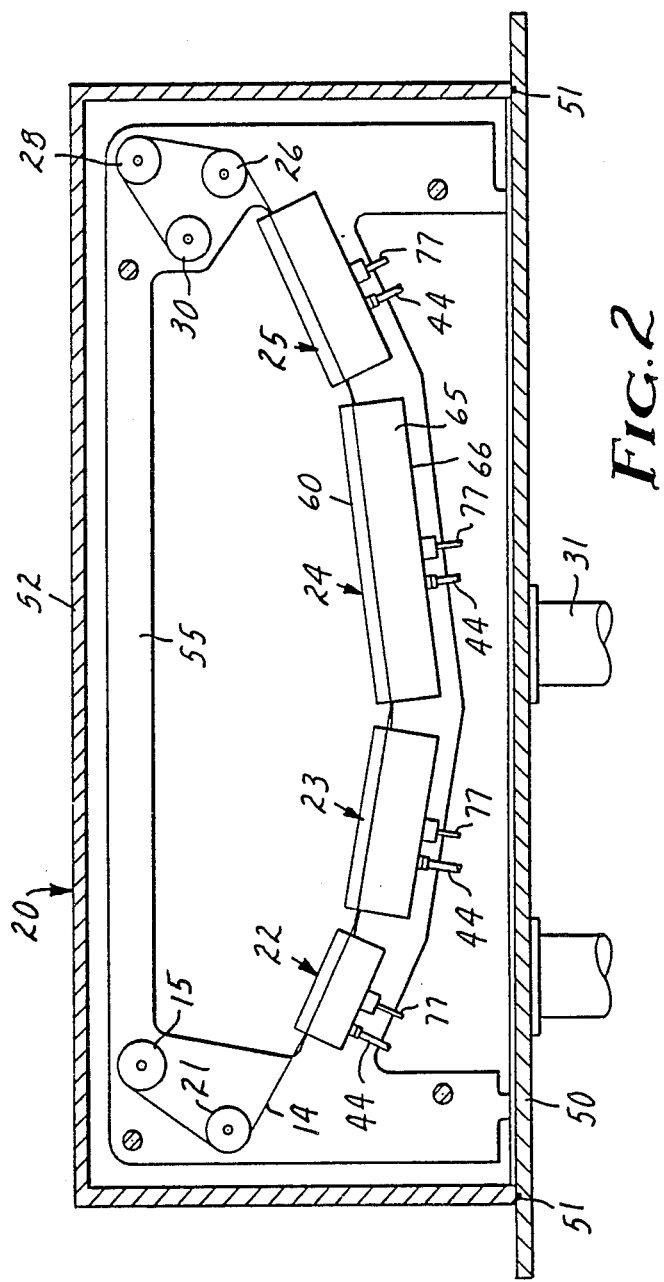
FIG. 2 is a diagrammatic longitudinal sectional view of the vacuum chamber enclosing a plurality of deposition chambers.

Referring back to FIG. 2, the evacuation chamber 20 is defined by a base plate 50 formed with a rectangular recess in which is disposed an O-ring 51 to form a seal about the bottom edge of a large rectangular cover 52 constructed of aluminum alloy with wall thicknesses capable of withstanding the pressure existing thereon.

Within the vacuum chamber defined by the cover 52 and base plate 50 is a frame 55 on which is rotatably mounted the supply roll 15, idler rolls 21 and 26, drive roll 28, and take-up roll 30. Also supported via the frame 55 is the web cleaning chamber 22 and deposition chambers 23, 24, and 25. All of the piping for the pumps is connected to the base plate 50 and the tubes 44 for the process gas pass through the base plate 50 to the different process chambers. Tension is maintained in the web 14 by a braking motor connected to the supply roll 15 and a winding motor on the take-up roll 30. The drive roll 28 determines the web speed.

Since the deposition chambers are all substantially the same in construction, deposition chamber 24, as illustrated in FIG. 3, 4, and 5 will be described in detail. This deposition chamber is formed to permit the web 14 to pass through the interior of the chamber and then exit with a thin-film coating deposited thereon. The deposition chamber comprises a platen 60 having a web guiding surface 61 projecting from one surface thereof disposed within the chamber and is provided with a plurality of openings in which are disposed cartridge heaters 62. The platen 60 is generally rectangular, and the surface 61 has a slight contour throughout its length to form a smooth surface for maintaining intimate contact with the web 14. The platen 60 is positioned on the upper surface of two opposed side walls 65, which extend upwardly from a base plate 66. The base plate 66 also has opposed end walls 67 and 68 which define the other two sides of the deposition chamber. Additional cartridge heaters 70 are disposed in the base wall 66. Positioned above the base wall 66 is a quartz plate 71 which covers the surface of the base plate 66 within the deposition chamber. Suitably insulated from the base plate 66 and extending through an opening generally centrally thereof is the contact for a rectangular electrode 75 which has a plurality of openings 76 formed therein. The process gas comes from the mixing chamber through the tube 44 and is directed into the deposition chamber between the electrode and the quartz plate 71, and by diffusion through openings 76 is positioned within the deposition chamber for forming the coating on the web 14. A lead 77 for the electrode 75 is directed to a source of either AC or DC power to affect the glow discharge plasma which is generated within the deposition chamber causing the resultant neutral radicals and ionic species to be deposited on the exposed surface of web 14.

Positioned adjacent the end walls 67 and 68 and adjustably mounted with respect to extended mounting plates 66a and 66b formed at the ends of the base plate 66 are gates 80 and 81. The gates 80 and 81 are deposed for movement toward and away from the web guiding surface 61 of the platen 60 to define gas conductance limiting slits 84 and 85 which define the inlet and outlet, respectively, for the web 14 with respect to the deposition chamber. Positioned symmetrically about the periphery of the chamber on end walls 67 and 68 are shims 87, 88, 89 and 90. These shims space the surface of the platen above the walls of the deposition chamber by 0.008 inch to allow gas discharge from the interior of the deposition chamber. These discharge slits defined by the shims are important to carry fine particles which usually result from the deposition process and restrict such particles from becoming lodged in the conductance limiting slits 84 and 85 through which the moving web must pass. In operation, the cartridge heaters permit the operating temperatures to be varied over a wide range as optimal temperatures are dependent on the materials being deposited and the substrate temperature limitations. Typical operating temperatures for depositing amorphous silicon films range between about 200° C. and about 300° C.

The shims space the platen off the walls of the chambers 22, 23, and 25 by 0.006 inch.

To produce amorphous silicon films the process gas usually includes a carrier gas such as hydrogen or helium along with silane ($SiH_4$), or silane ($SiH_4$) and suitable dopant gases such as diborane ($B_2H_6$) or phosphine ($PH_3$). When utilizing the apparatus of the instant invention to produce PIN or NIP amorphous silicon photovoltaic devices, the P-type layer is conventionally doped with diborane at concentration levels of about 1 weight percent while the N-type layer is doped with phosphine at similar concentration levels. As the intrinsic (I) layer is generally left undoped or at most doped at much lower levels, it is necessary to prevent diffusion of the diborane/phosphine into the I-chamber used for the deposition of the intrinsic layer. Additionally, the deposition chambers are constructed to prevent dopant containing gas for the P-type layer from diffusing into the chamber utilized for producing the N-type layer, and vice versa, as the dopants compensate each other.

Gas flow rates during operation are readily controlled by the mass flow controllers on the gases being introduced into the chambers. Such mass flow controllers are available from Tylan Corporation, Carson, Calif., and are identified as Model FC 260. The mass flow controllers are adjusted such that the pressure in each of the deposition chambers is about 1.0 Torr.

Tests were made to determine whether there was any detectable gas diffusion causing cross-contamination in coatings formed in adjacent process chambers. A specific test example follows:

EXAMPLE 1

Ten sets of 3 simultaneously deposited amorphous silicon film samples were generated utilizing the multichamber deposition chamber 20 to evaluate the degree of isolation achieved with this apparatus. A polyimide substrate 14 was advanced in a stepwise manner through the three deposition chambers 23, 24 and 25 following simultaneous deposition of a single layer of amorphous silicon in each of the three deposition chambers, these runs thus yielding 30 samples. The first, sixth and the tenth run in the series were made without benefit of added dopants while the intervening samples were generated with varying levels of boron via $B_2H_6$ and phosphorous via $PH_3$ added to the first and third sample in each sequence of three. All of the film samples were thence evaluated as to activation energy (by measuring electrical conductivity at various temperatures according to standard test methods) and light and dark conductivity values (measured at room temperature under well known test procedures). The amorphous silicon layers were deposited utilizing conductance limiting slits 84 and 85 having a width of about 125 microns in the P-chamber 23 and N-chamber 25 (those chambers designated for introduction of the boron and phosphorous dopants respectively), while a conductance limiting slit of about 175 microns wide was used in the I-chamber 24 (the chamber designated for deposition of intrinsic, i.e., undoped amorphous silicon). A platen temperature of about 200° C. was used in the P-chamber with platen temperatures of about 250° C. in the I and N chambers. A system chamber pressure of about 0.026 Torr was maintained while the pressure maintained in each of the deposition chambers was about 1.0 Torr. An RF power level of about 10 watts was utilized in the P and N chambers while about 20 watts was utilized in the I chamber. A deposition time of about 30 minutes provided a film having a thickness of about 5000 angstroms. The carrier gas in all cases was hydrogen, the silane concentration being about 10% in said hydrogen carrier. Gas flow rates were maintained at about 50 standard cubic centimeters per minutes (SCCM) in the P-chamber, about 170 SCCM in the I-chamber, and about 75 SCCM in the N-chamber. The following run sequence table identifies the specific gas composition used in generating each of the 30 amorphous silicon film samples thereby generated.

| Run Sequence Table | | | |
|---|---|---|---|
| Run # | P-Chamber | I-Chamber | N-Chamber |
| 1 | I | I | I |
| 2 | B* | I | I |
| 3 | $B_1$ | I | I |
| 4 | I | I | $P_1$ |
| 5 | $B_1$ | I | $P_1$ |
| 6 | I | I | I |
| 7 | $B_2$ | I | I |
| 8 | I | I | $P_2$ |
| 9 | $B_2$ | I | $P_2$ |
| 10 | I | I | I |

KEY
I = 10% $SiH_4$ in $H_2$, No dopant added
B* = 10% $SiH_4$ in $H_2$, 1% $B_2H_6$ in $SiH_4$ without RF applied
$B_1$ = 10% $SiH_4$ in $H_2$, 1% $B_2H_6$
$B_2$ = 10% $SiH_4$ in $H_2$, 2% $B_2H_6$
$P_1$ = 10% $SiH_4$ in $H_2$, 1% $PH_3$ in $SiH_4$
$P_2$ = 10% $SiH_4$ in $H_2$, 1.7% $PH_3$ in $SiH_4$ The measured activation energy, dark conductivity and light conductivity for each of the 30 samples is listed below.

| | P-Chamber | | | I-Chamber | | | N-Chamber | | |
|---|---|---|---|---|---|---|---|---|---|
| Run # | $E_a$(eV) | Dark Conductivity (ohm cm)$^{-1}$ | Light Conductivity (ohm cm)$^{-1}$ | $E_a$(eV) | Dark Conductivity (ohm cm)$^{-1}$ | Light Conductivity (ohm cm)$^{-1}$ | $E_a$(eV) | Dark Conductivity (ohm cm)$^{-1}$ | Light Conductivity (ohm cm)$^{-1}$ |
| 1 | .94 | $4.6 \times 10^{-11}$ | $3.2 \times 10^{-5}$ | .75 | $6.6 \times 10^{-10}$ | $8.4 \times 10^{-5}$ | .75 | $8.0 \times 10^{-10}$ | $1.3 \times 10^{-5}$ |
| 2 | | (no film) | | .73 | $3.9 \times 10^{-9}$ | $1.6 \times 10^{-4}$ | .89 | $1.9 \times 10^{-9}$ | $1.2 \times 10^{-4}$ |
| 3 | .48 | $1.1 \times 10^{-5}$ | $3.2 \times 10^{-5}$ | .75 | $1.6 \times 10^{-9}$ | $2.4 \times 10^{-4}$ | .77 | $2.1 \times 10^{-9}$ | $2.4 \times 10^{-4}$ |
| 4 | .63 | $<1.5 \times 10^{-12}$ | $5.9 \times 10^{-6}$ | .69 | $7.8 \times 10^{-9}$ | $3.0 \times 10^{-4}$ | .20 | $8.3 \times 10^{-3}$ | $9.7 \times 10^{-3}$ |
| 5 | .48 | $9.3 \times 10^{-6}$ | $3.2 \times 10^{-5}$ | .69 | $4.5 \times 10^{-9}$ | $2.5 \times 10^{-4}$ | .20 | $6.2 \times 10^{-3}$ | $7.3 \times 10^{-3}$ |
| 6 | .95 | $5.8 \times 10^{-12}$ | $5.9 \times 10^{-6}$ | .70 | $8.1 \times 10^{-9}$ | $2.3 \times 10^{-4}$ | .71 | $3.0 \times 10^{-8}$ | $4.7 \times 10^{-4}$ |
| 7 | .43 | $2.9 \times 10^{-5}$ | $4.7 \times 10^{-5}$ | .74 | $1.8 \times 10^{-9}$ | $2.1 \times 10^{-4}$ | .62 | $3.4 \times 10^{-8}$ | $2.7 \times 10^{-4}$ |
| 8 | .79 | $1.5 \times 10^{-12}$ | $5.5 \times 10^{-6}$ | .69 | $1.1 \times 10^{-8}$ | $3.6 \times 10^{-4}$ | .21 | $8.0 \times 10^{-3}$ | $9.2 \times 10^{-3}$ |
| 9 | .43 | $2.1 \times 10^{-5}$ | $3.9 \times 10^{-5}$ | .67 | $6.9 \times 10^{-9}$ | $3.2 \times 10^{-4}$ | .21 | $9.3 \times 10^{-3}$ | $1.1 \times 10^{-2}$ |
| 10 | .88 | $<1.0 \times 10^{-11}$ | $5.8 \times 10^{-6}$ | .74 | $3.2 \times 10^{-9}$ | $1.9 \times 10^{-4}$ | .44 | $9.9 \times 10^{-7}$ | $8.9 \times 10^{-4}$ |

The table shows that the activation energy and electrical conductivity of films deposited in the I-chamber were relatively constant while films simultaneously deposited in the P and N-chambers varied widely from run to run. In other words, the affects of adding dopants to the P and N-chambers are clearly observed while the dopants had no observable effect on the I films. It must be concluded that cross-contamination between the adjacent deposition chambers was restricted to an undetectable level.

Other flexible substrates could be used to produce photovoltaic cells. Such substrates include stainless steel, aluminum, and other polymeric webs having high glass transition values. Modifications of the web guides may be necessary for use with metal substrates. Further, the device could include a deposition apparatus including additional chambers for generation of tandem photovolatric devices or chambers may be added where metalization of a polymeric substrate would be desired.

Having thus described a preferred embodiment of the invention and modifications thereof, it is to be understood that other changes or modifications may be made, and other materials used, without departing from the scope of the invention as defined in the appended claims.

We claim:

1. A method for depositing thin coatings on a substrate comprising the steps of:
   evacuating a large chamber in which has been placed a roll of web material;
   advancing the web material from the supply roll through a web cleaning chamber disposed within said large evacuated chamber in the presence of a glow discharge;
   advancing the web material through a deposition chamber disposed within said large evacuated chamber and depositing thereon elements in the presence of a glow discharge resulting from the introduction of process gas into said deposition chamber at a pressure above that of said large chamber;
   advancing the web material through a second deposition chamber disposed within said large evacuated chamber in which is applied a second coating on the web material from elements in a process gas applied in the presence of glow discharge at a pressure above that of said large chamber;
   advancing the web material through a third deposition chamber disposed within said large evacuated chamber to apply a third thin coating on the web material of an element in the presence of a glow discharge of a process gas;
   rewinding the web material on a take-up roll disposed within said large chamber; and
   maintaining the reduced atmosphere within said large chamber below the pressure in said deposition chambers for restricting diffusion of process gas from one deposition chamber to another deposition chamber.

* * * * *